United States Patent
Mecklai et al.

[11] Patent Number: 6,167,109
[45] Date of Patent: Dec. 26, 2000

[54] COMPACT BUFFER DESIGN FOR SERIAL I/O

[75] Inventors: Hussein K. Mecklai, Whitehall, Pa.;
Andrew Lawrence Webb, Hamilton, N.J.

[73] Assignee: Lucent Technologies Inc., Murray Hill, N.J.

[21] Appl. No.: 09/315,274

[22] Filed: May 20, 1999

[51] Int. Cl.$^7$ .................................................. G11C 19/00
[52] U.S. Cl. ............................................. 377/64; 377/54
[58] Field of Search ......................................... 377/54, 64

[56] References Cited

U.S. PATENT DOCUMENTS

| | | | |
|---|---|---|---|
| 3,950,635 | 4/1976 | Constant | 235/156 |
| 3,965,342 | 6/1976 | Constant | 235/156 |
| 4,025,772 | 5/1977 | Constant | 235/156 |
| 4,080,660 | 3/1978 | Constant | 364/715 |
| 5,042,007 | 8/1991 | D'Luna | 365/78 |

*Primary Examiner*—Margaret R. Wambach

[57] ABSTRACT

A buffer design for use in digital signal processing for providing parallel shifting of digital data and serial output of the shifted data. The buffer includes an input shift register for receiving and shifting an input digital word, and one or more parallel shift registers connected to the input shift register for receiving and parallel shifting the shifted digital word output by the input shift register. An output shift register is connected to the parallel shift registers for shifting and serially outputting the shifted data word. The use of parallel shift registers in the inventive buffer allows for a more efficient use of chip surface area in the buffer design, thereby increasing overall chip yield and reducing chip cost.

4 Claims, 1 Drawing Sheet

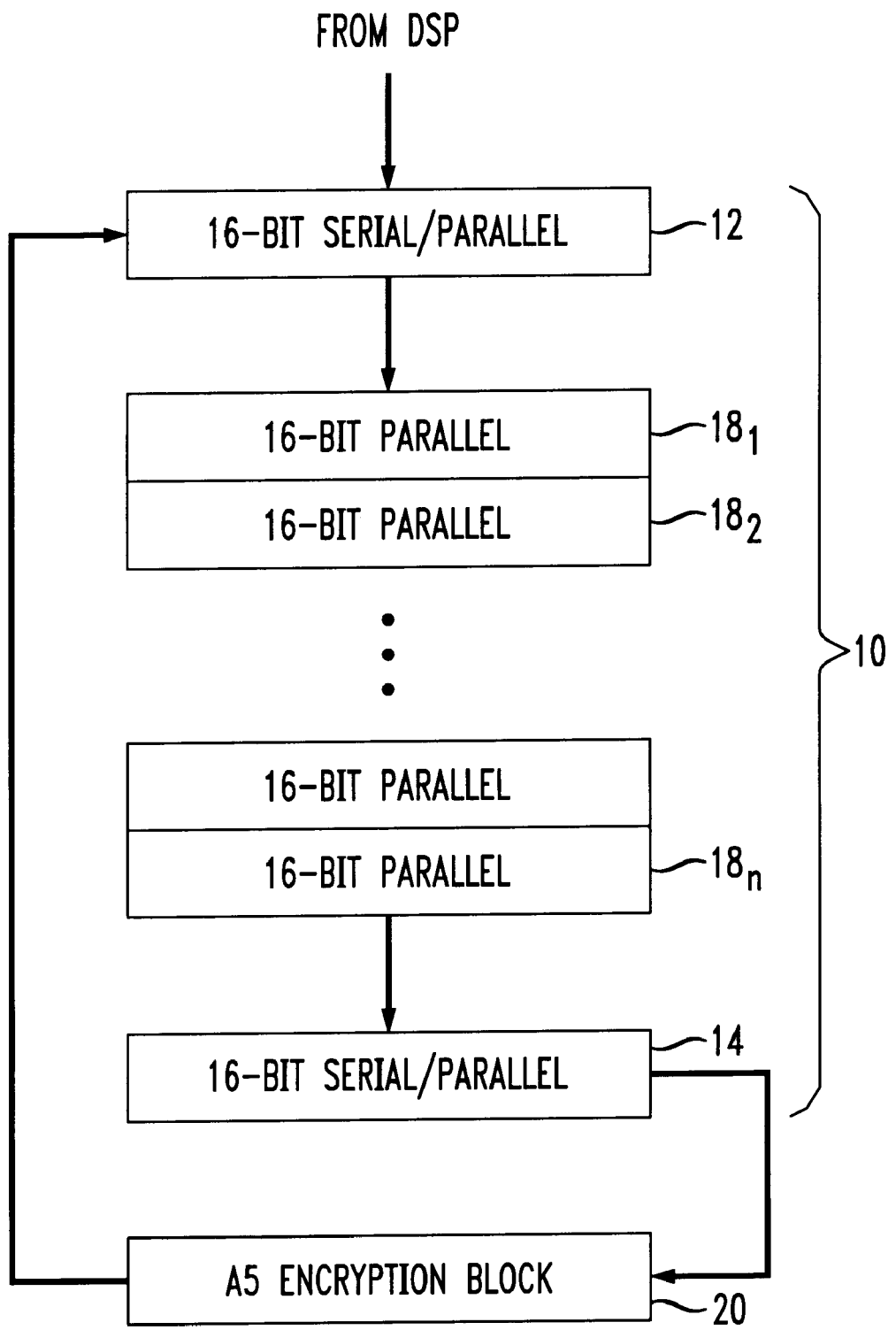

COMPACT BUFFER DESIGN FOR SERIAL I/O

BACKGROUND OF THE INVENTION

1. Field of the Invention

The present invention pertains to a buffer design for use in digital signal processing applications where reduction in microchips size is an important consideration. More particularly, the present invention relates to a compact buffer design employing parallel registers and providing serial input and serial output of data.

2. Description of the Related Art

In digital signal processing applications, digital data is provided directly and indirectly to and from a digital signal processor (DSP) in either a parallel format or a serial format. Typically, data is converted between a parallel format and a serial format by utilizing a serial input and output (SIO) interface. As an alternative to an SIO, a serial shift buffer register may be implemented.

Both of the above-mentioned devices have drawbacks. In particular, both the serial shift buffer register and the SIO are relatively large in a physical sense due to the wiring required for connecting together the serial shift registers implemented in such devices and, consequently, occupy a large chip area. In the case of a serial shift register or an SIO manufactured on a common digital chip with a DSP, the relatively large size of the SIO or serial shift register decreases chip yield, i.e. fewer chips are produced per wafer or substrate. For a mixed signal chip receiving both analog and digital signals, the relatively large sizes of the SIO and serial shift registers result in a larger chip and a correspondingly higher manufacturing cost per unit area due to the masking steps involved in production. Moreover, the interrupt frequency associated with a DSP reading from and writing to an SIO is relatively high, reducing the overall processing speed of a system employing the DSP and SIO components.

SUMMARY OF THE INVENTION

An advance is made over the prior art in accordance with the present invention by providing a compact buffer design. The compact buffer design of the invention occupies a smaller chip area than prior art buffers, thereby increasing chip yield while reducing manufacturing cost, especially for mixed signal chips. This advantageous result is accomplished by configuring a buffer from a plurality of shift registers including an input register, an intermediate register, and an output register. The input shift register receives a data signal, e.g. an input bit word, from a DSP and produces a first shifted bit word. The intermediate register is a parallel shift register electrically connected to the input shift register for receiving and parallel shifting of the first shifted bit word and for producing a second shifted bit word. The output register is electrically connected to the intermediate register and receives and shifts the second shifted bit word to produce an output shifted bit word. The use of a parallel shift register for the intermediate register allows for efficient wiring between the registers, thereby reducing the amount of surface area required for the buffer and increasing chip yield.

In a preferred embodiment, the input and output registers are serial and parallel registers, i.e. capable of operating in both serial and parallel modes, and the intermediate register includes a plurality of parallel registers.

Other objects and features of the present invention will become apparent from the following detailed description considered in conjunction with the accompanying drawings.

It is to be understood, however, that the drawings are designed solely for purposes of illustration and not as a definition of the limits of the invention, for which reference should be made to the appended claims.

BRIEF DESCRIPTION OF THE DRAWINGS

In the drawings:

The FIGURE depicts a block diagram of a compact buffer design in accordance with a preferred embodiment of the present invention.

DETAILED DESCRIPTION OF THE PRESENTLY PREFERRED EMBODIMENT

Turning now to the FIGURE, a buffer 10 for use in conjunction with digital signal processing is shown. Buffer 10 may for example be employed in a ciphering application in which it receives a digital signal, such as a 16-bit word, from a digital signal processor (not shown) and outputs a buffered signal to a processor 20, such, for example, as an A5 encryption block of the type commonly used in encrypting digital cellular telephone signals. In such an application, the input of buffer 10 may be directly connected to a digital signal processor (DSP) or, alternatively, may receive a digital signal from a bus, transmission line, or other component connected to or otherwise interfaced with a DSP. Moreover, processor 20 that receives the output of the buffer can be any component for carrying or acting upon digital data, such as a logic circuit. Buffer 10 may also be employed in a transmitter device wherein the buffer receives a processed DSP signal and provides it to a transmitter.

Buffer 10 is constructed using standard VLSI chip manufacturing techniques as are known in the art and may be formed on a wafer containing digital circuits such as digital signal processors, or may be formed on a wafer containing mixed signal circuits that process both digital and analog signals. As shown in the FIGURE, buffer 10 includes an input register 12, depicted therein as a 16-bit serial/parallel register that receives an n-bit word (e.g. a 16-bit word) from the DSP. In the preferred embodiment, input register 12 is capable of operating in both a serial mode and a parallel mode, although either mode may be used based on the particular application in which buffer 10 is employed or implemented. Input register 12 operates in a manner well-known to those having ordinary skill in the art in that it receives the digital n-bit word from the DSP and, depending on its mode of operation, shifts the bits in the word either serially or in parallel to produce a first-shifted word.

One or more intermediate registers 18 are provided for receiving the first shifted word from input register 12, for further shifting the received word, and for outputting a second shifted word. The intermediate registers 18 are parallel-shift registers which parallel shift the bits in the first shifted word in a well-known manner. It has been discovered in accordance with the invention that by utilizing parallel intermediate shift registers 18 in the buffer 10 of the invention, the amount of surface area required on a chip substrate on which the buffer is formed can be reduced due to the interconnection or wiring requirements of the parallel registers 18.

In the preferred embodiment, a plurality of parallel shift registers ($18_1$–$18_n$) are employed in a stacked or interconnected manner with the total number n equal to two less than the number of words that the buffer can accommodate. The output of the composite intermediate register 18 so formed is provided to an output serial/parallel register 14, similar to input register 12, for shifting the second shifted bit word and producing an output shifted bit word that is then provided to the processor 20.

One environment in which the inventive buffer 10 is particularly useful is the application of encryption techniques of the type used in connection with the wireless transmission of data, such as in a global cellular phone transmission system, and in particular in connection with the known A5 cipher technique. By using the inventive buffer 10 in such a technique, and as shown in FIG. 1, the DSP writes data into the buffer by transferring a 16-bit word to the input shift register 12; this transfer can be performed in a serial or a parallel manner. Upon receipt of an enablement command, input register 12 will shift and then parallel transfer the bit word received from the DSP to the parallel intermediate register (e.g. register 18$_1$). Upon receipt of successive enablement commands, the so-shifted data word will pass down through the plurality of intermediate registers 18 until the resulting shifted word is parallel transferred to output register 14 of buffer 10. The resulting word will then be input, in a serial manner in accordance with A5 encryption requirements, to the A5 encryption block 20 where the data word is acted upon by the encryption block 20 and serially output to the input shift register 12, which receives the input as a serial input. The data word can then be shifted through another cycle in buffer 10 or output from encryption block 20 for further use, whereupon a new data word will be input to buffer 10 and processed in the manner discussed above.

As will be appreciated, although the operation of the inventive buffer 10 has been described in connection with an application of the A5 encryption technique, the buffer 10 can, likewise, be advantageously used or implemented in numerous other applications in which reduction or minimization of chip surface area is desirable or required and/or in which chip cost and device yield are important design considerations.

While there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A compact buffer for interfacing with an input carrying a digital input bit word having n bits, comprising:

a single serial input shift register connected to the input for receiving the digital input bit word and for serial shifting the input bit word to produce a first shifted bit word;

a serial shift output register for receiving a third shifted bit word derived from said first shifted bit word and for producing an output serial-shifted bit word as an output of said buffer; and first and second intermediate parallel shift registers, said first intermediate parallel shift register connected to said single serial input shift register for receiving said first shifted bit word and for parallel shifting said first shifted bit word for producing a second shifted bit word, said second intermediate parallel shift register connected to said first intermediate parallel shift register for receiving said second shifted bit word for producing a third shifted bit word for receipt by said output shift register wherein said input shift register, output shift register and first and second intermediate parallel shift registers are formed on a common microchip.

2. The compact buffer of claim 1, wherein said input shift register and said output shift register comprise parallel and serial shift registers.

3. The compact buffer of claim 1, wherein said second intermediate parallel shift register comprises a plurality of n-bit parallel shift registers sequentially connected to each other.

4. The compact buffer of claim 3, wherein said plurality of second parallel shift registers comprise no more than n−1 parallel shift registers.

* * * * *